United States Patent [19]
Kotowski

[11] Patent Number: 5,867,054
[45] Date of Patent: Feb. 2, 1999

[54] CURRENT SENSING CIRCUIT

[75] Inventor: Jeffrey P. Kotowski, Nevada City, Calif.

[73] Assignee: National Semiconductor Corporation, Santa Clara, Calif.

[21] Appl. No.: 903,582

[22] Filed: Jul. 31, 1997

[51] Int. Cl.[6] ........................................... H01C 7/13
[52] U.S. Cl. ........................ 327/513; 327/512; 327/262; 327/362; 327/83
[58] Field of Search .................... 327/512, 513, 327/387, 538, 83, 138, 262, 362, 91, 93

[56] References Cited

U.S. PATENT DOCUMENTS

| | | | |
|---|---|---|---|
| 4,517,511 | 5/1985 | Suto | 324/52 |
| 4,928,200 | 5/1990 | Redl et al. | 361/93 |
| 5,198,701 | 3/1993 | Davies et al. | 327/513 |
| 5,534,788 | 7/1996 | Smith et al. | 324/771 |

Primary Examiner—Timothy P. Callahan
Assistant Examiner—An T. Luu
Attorney, Agent, or Firm—Limbach & Limbach LLP

[57] ABSTRACT

A current sensing circuit which provides for accurate in-line current sensing with extremely low insertion loss. A low valued resistor (e.g., 0.005 ohms) is connected in series with the source and load of the current to be measured. An analog-to-digital converter (ADC) is used to measure the resulting voltage generated across the resistor. In order to minimize inaccuracies due to voltage offsets introduced by the measurement circuitry when measuring the low voltages generated across such a low resistance, the ADC is "chopped," thereby causing self cancellation of any such offset voltages. A voltage source which provides a reference voltage for the ADC has a temperature coefficient which is approximately equal in magnitude to the temperature coefficient of the resistor. Hence, for a given current through the resistor, the reported voltage as measured across the resistor remains constant over temperature.

18 Claims, 4 Drawing Sheets

5,867,054

CURRENT SENSING CIRCUIT

BACKGROUND OF THE INVENTION

1. Field of the Invention

The present invention relates to current sensing circuits, and in particular, to current sensing circuits which provide for direct, in-line, non-inductive current sensing with low insertion loss.

2. Description of the Related Art

Unlike voltage monitoring, which can be done with a high degree of precision while introducing virtually no losses into the system whose voltage is being monitored, current sensing has required sacrificing precision for low insertion loss or suffering high insertion loss for greater precision. For example, one conventional current sensing technique with low insertion loss requires the use of an inductive sensor which senses current by the presence and strength of a magnetic field surrounding the conductor in which the current is conveyed. While the insertion loss introduced by this technique is very low (assuming negligible effects from interaction between the inductive sensor and the magnetic field generated by the current), a high degree of mechanical precision is required in that the proximity and placement of the inductive sensor must be consistent and carefully calibrated.

A conventional direct, in-line current sensing technique requires the insertion of a resistor in series with the load whose current is to be sensed. However, due to the necessity of having a relatively high voltage across such resistor so as to avoid errors caused by a variety of factors such as noise, such resistor can introduce significant losses due to its own power dissipation. While reducing the resistance will reduce such losses, the voltage generated by the current of interest is also reduced, thereby resulting in increased errors when such low voltages are measured. Such errors include inaccurate voltage readings due to offset voltages in the monitoring circuitry, as well as inaccuracies due to noise and temperature drift of the sensing resistor.

Accordingly, it would be desirable to have a current sensing circuit which allows high precision, in-line current sensing with low insertion loss.

SUMMARY OF THE INVENTION

A current sensing circuit in accordance with the present invention allows high precision, in-line current sensing with low insertion loss, while maintaining such high precision over a wide temperature range by compensating for variations in the current sensing element caused by temperature changes.

In accordance with one embodiment of the present invention, a current sensing circuit which allows in-line current sensing with low insertion loss includes a resistive circuit, a signal sampling circuit and a reference signal generator circuit. The resistive circuit has a resistance which varies in a first relation to temperature and is configured to conduct a measured current and in response thereto provide a measured voltage which is proportional to such measured current and resistance. The signal sampling circuit is coupled to the resistive circuit and is configured to sample the measured voltage and receive a reference signal and in accordance therewith provide an output signal with values which represent values of the measured voltage in accordance with a predetermined gain relationship and correspond to values of the measured current. The reference signal generator circuit is coupled to the signal sampling circuit and is configured to generate the reference signal. The reference signal varies in a second relation to temperature which is approximately equal in magnitude to the first temperature relation, and the correspondence between selected ones of the output signal values and selected ones of the measured current values is substantially maintained over a range of temperatures.

These and other features and advantages of the present invention will be understood upon consideration of the following detailed description of the invention and the accompanying drawings.

DETAILED DESCRIPTION OF THE INVENTION

Figure 1:
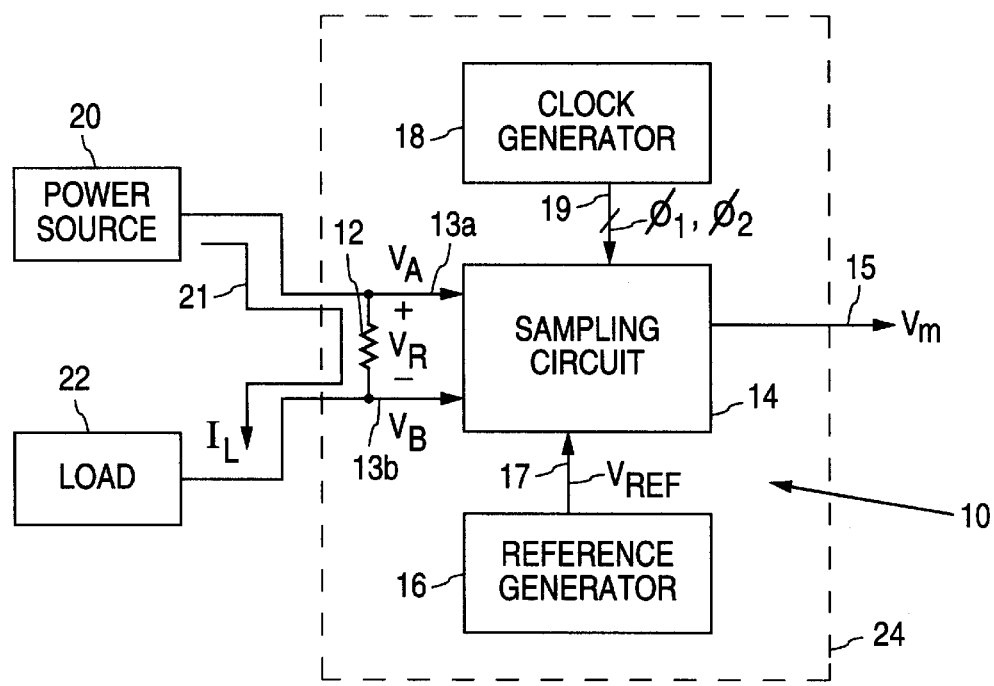
FIG. 1 is a functional block diagram of a current sensing circuit for performing in-line current sensing with low insertion loss in accordance with one embodiment of the present invention.

Referring to FIG. 1, a current sensing circuit 10 in accordance with one embodiment of the present invention includes a sensing resistor 12, a sampling circuit 14, a reference generator 16 and a clock generator 18, all interconnected substantially as shown. This sensing circuit 10, by way of the sensing resistor 12, senses a load current 21 provided by a power source 20 to a load 22.

This current sensing circuit 10 can be implemented in integrated form, e.g., as an integrated circuit 24, or contained in some other form of circuit configuration or enclosure 24 with terminals 13a, 13b for connecting in-line for sensing the load current 21. This circuit 10 can also be implemented in combination where the sampling circuit 14, reference generator 16 and clock generator 18 are implemented as part of an integrated circuit having a leadframe in which the sensing resistor 12 is incorporated as an integral part. An example of this type of implementation in which a sensing resistor is incorporated as an integral part of a leadframe for an integrated circuit containing a current sensing circuit is described in U.S. Pat. No. 5,534,788 (the disclosure of which is incorporated herein by reference).

Conduction of the load current 21 by the sensing resistor 12 causes a voltage $V_R$ to be generated across the resistor 12. This voltage has two components $V_A$, $V_B$ which, together, form a differential voltage $V_A-V_B$. As discussed in greater detail below, the sampling circuit 14 samples this voltage $V_A-V_B$ to produce a digital signal $V_M$ 15 representing the measured voltage. The reference generator 16 provides a reference voltage $V_{REF}$ 17 which has a temperature coefficient approximately equal in magnitude to the temperature coefficient of the sensing resistor 12. The clock generator 18 provides a set 19 of clock signals $\phi_1$, $\phi_2$ for controlling the sampling performed by the sampling circuit 14.

In accordance with the discussion above, as well as the discussion below, the following should be understood. Although the current sensing circuit 10 of FIG. 1 is represented as a "high side" current sensing circuit, i.e., with the sensing resistor 12 connected between the power source 20 and the load 22, a current sensing circuit in accordance with another embodiment of the present invention will have the sensing resistor 12 connected between the load 22 and circuit ground.

Figure 2:
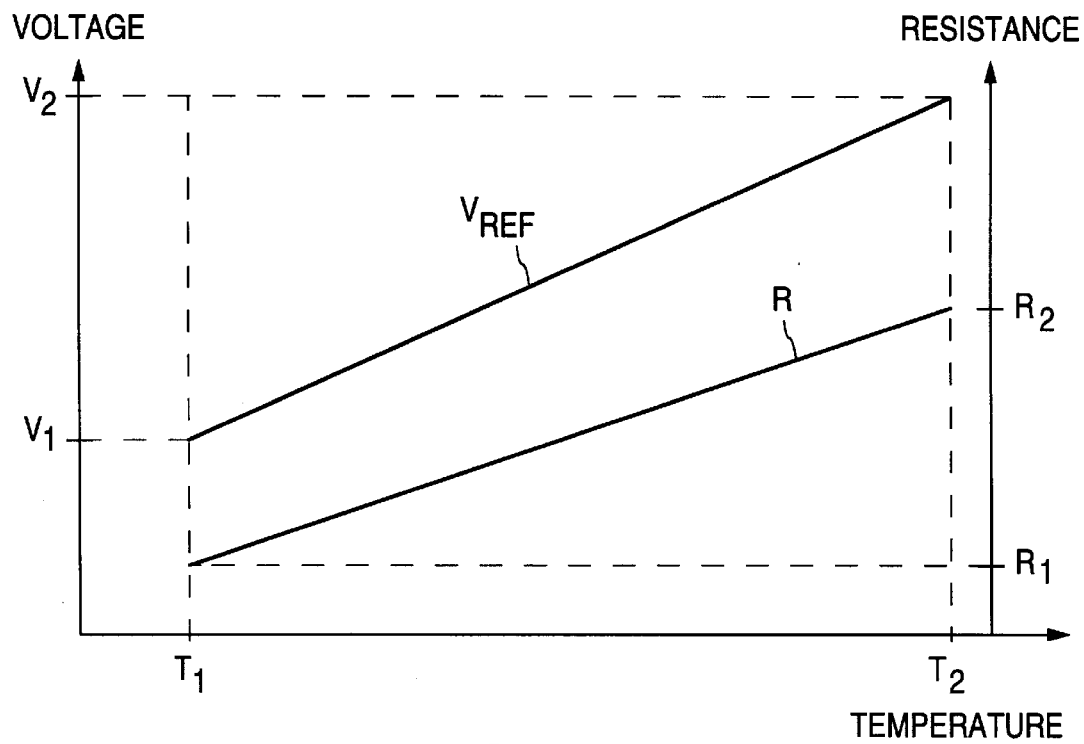
FIG. 2 is a graph representing conceptually the equality between the temperature coefficient of the voltage reference generated by the reference generator and the temperature coefficient of the sensing resistor in the circuit of FIG. 1.

Referring to FIG. 2, the compensation for the temperature coefficient of the sensing resistor 12 by the temperature coefficient of the reference voltage 14 can be represented conceptually as shown. Over the range of temperatures $T_1$ through $T_2$, the value R of the resistor 12 ranges between the resistance values of $R_1$ through $R_2$, respectively. Similarly, over this temperature range $T_1-T_2$, the reference voltage $V_{REF}$ 17 ranges between voltage values $V_1$ and $V_2$. The temperature coefficient $T_{C(VREF)}$ $(=\Delta V_{REF}/(V_1|T_1-T_2|))$ of the reference voltage $V_{REF}$ 17 is established to be approximately equal to the temperature coefficient $T_{C(R)}(=\Delta R/(R_1|T_1-T_2|))$ of the sensing resistor 12. Due to the effective division of the input signal $V_A-V_B$ by the reference voltage $V_{REF}$ as performed within the sampling circuit 14 (e.g., via an analog-to-digital signal conversion), net result of this is that the digital signal $V_M$ 15 representing the measured voltage remains substantially constant over temperature for a given load current 21 (FIG. 1).

Figure 3:
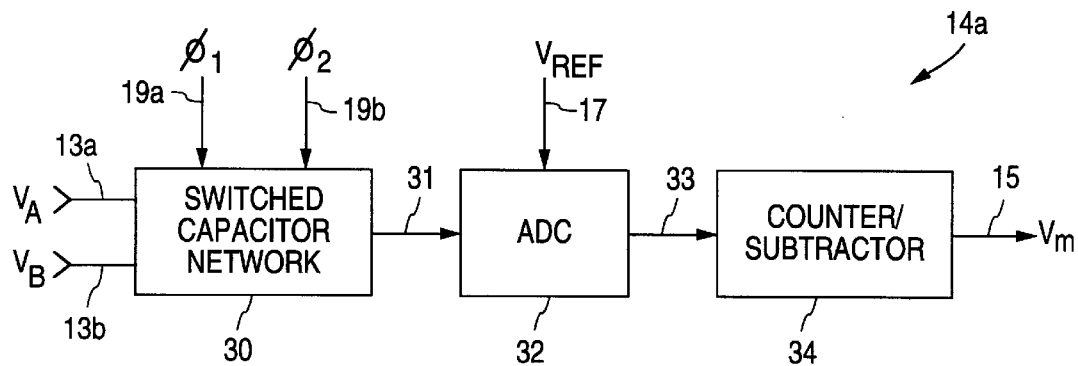
FIG. 3 is a functional block diagram of one embodiment of the sampling circuit of FIG. 1.

Referring to FIG. 3, one embodiment 14a of the sampling circuit 14 of FIG. 1 includes a switched capacitor network 30, an analog-to-digital converter (ADC) 32 and a counter/subtractor 34. The switched capacitor network 30, controlled by non-overlapping clock phases $\phi_1$ 19a, $\phi_2$ 19b, sample the voltage $V_A-V_B$ across the resistor 12 (FIG. 1) to produce an analog sample voltage 31 (which may be single-ended or differential, as desired). This analog sample voltage 31 is then converted to a digital signal 33 by the ADC 32 based upon its reference voltage 17 from the reference generator 16. This digital signal 33 is then subtracted by the counter/subtractor 34 (discussed in more detail below) to produce the digital signal 15 representing the measured voltage. (It should be understood that the ADC 32 can be of virtually any type desired, e.g., delta-sigma, successive approximation, flash converter, etc.)

Figure 4:
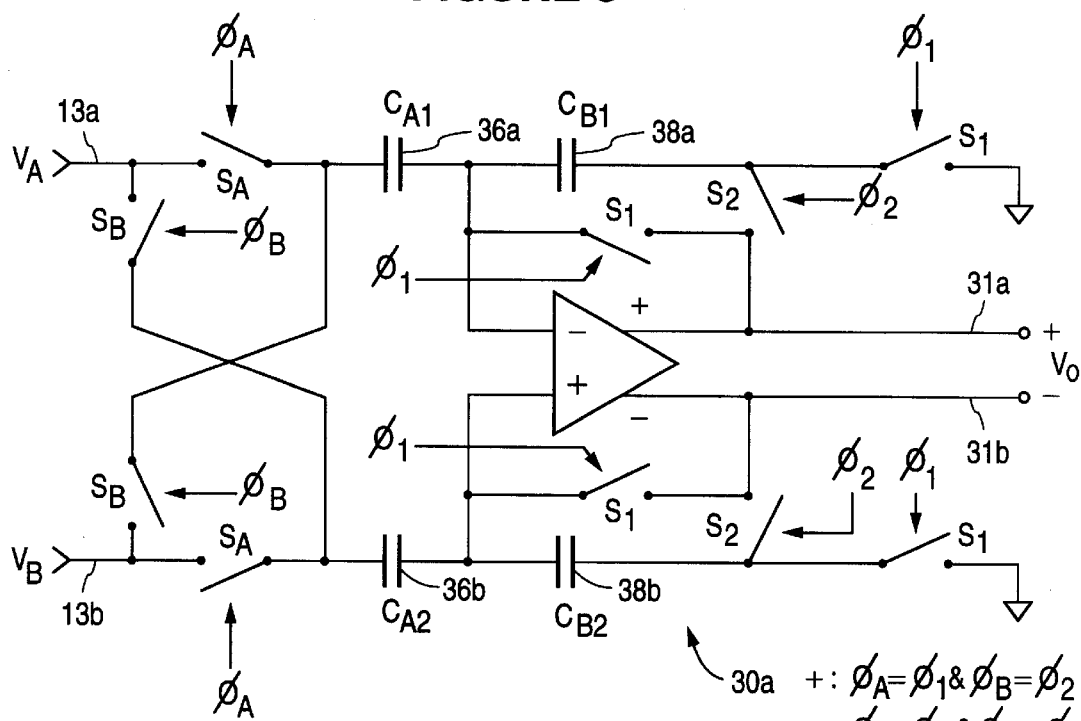
FIG. 4 is a schematic diagram of one embodiment of the switched capacitor network of FIG. 3.
Figure 5:
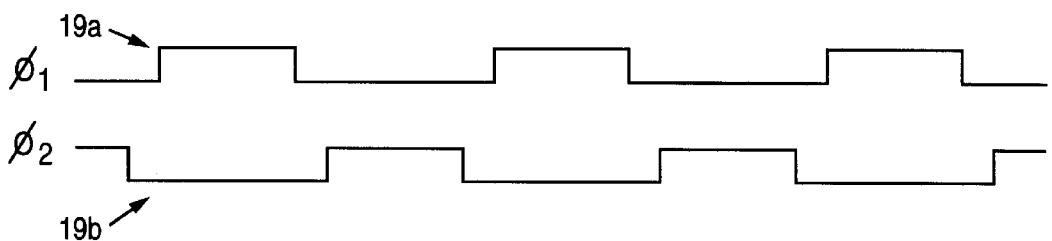
FIG. 5 is a timing diagram of the clock signals used to control the switched capacitor network of FIGS. 4 and 6.

Referring to FIG. 4, one embodiment 30a of the switched capacitor network of FIG. 3 can be implemented as shown. Switches $S_A$ and $S_B$, controlled by clock phases $\phi_A$ and $\phi_B$, respectively, and switches $S_1$ and $S_2$, controlled by clock phases $\phi_1$ and $\phi_2$, respectively, switch the input voltages $V_A$ and $V_B$ alternately across two in-line capacitors 36a, 36b to produce the analog sample voltage 31 which, in this case, is composed of differential phases 31a, 31b. When the corresponding in-line capacitors 36a, 36b and feedback capacitors 38a, 38b are equal in value, i.e., $C_{A1}=C_{A2}$ and $C_{B1}=c_{b2}$, the circuit produces a gain of $C_{A1}/C_{B1}$. Clock phases $\phi_A$ and $\phi_B$ are alternate clock phases $\phi_1$ 19a and $\phi_2$ 19b which are mutually non-overlapping, as shown in FIG. 5. During "positive" sampling, clock phases $\phi_A$ and $\phi_B$ are equal to phases $\phi_1$ and $\phi_2$, respectively, while during "negative" sampling, clock phases $\phi_A$ and $\phi_B$ are phases $\phi_2$ and $\phi_1$, respectively. This sampling technique is well known in the art.

Figure 6:
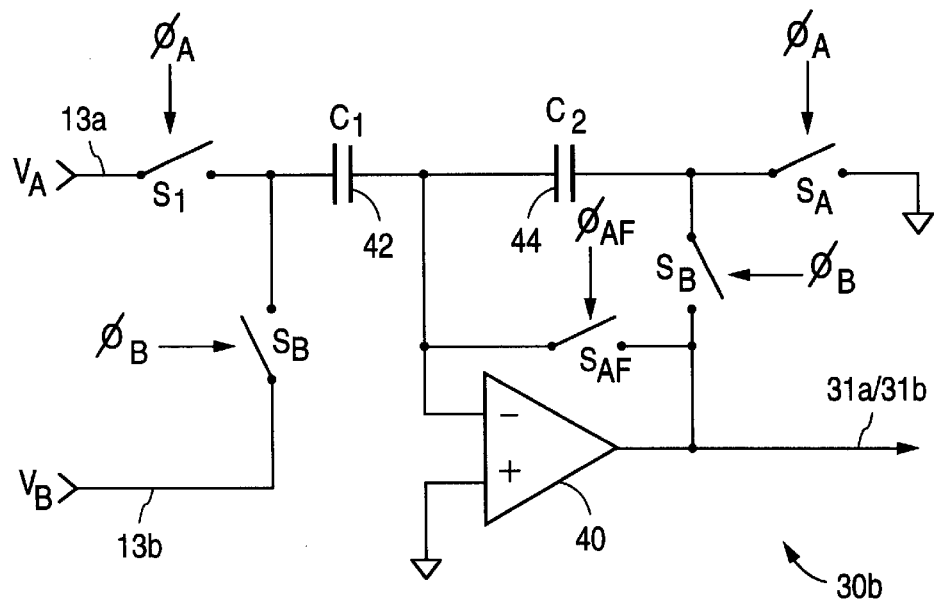
FIG. 6 is a schematic diagram of an alternative embodiment of the switched capacitor network of FIG. 3.

FIG. 6, an alternative embodiment 30b of the switched capacitor network 30 of FIG. 3 can be implemented as shown. This embodiment 30b, as depicted, is single-ended in that it samples one of the input voltages $V_A$, $V_B$ and produces the corresponding one of the analog sample voltage phases 31a, 31b. Similar to the embodiment of FIG. 4, switches $S_A$ and $S_B$ (plus feedback switch $S_{AF}$) are controlled by clock phases $\phi_A$ and $\phi_B$ (and feedback clock phase $\phi_{AF}$) to sample the input voltage $V_A-V_B$ with the two capacitors 42, 44. This sampling technique is also well known in the art.

Figure 7:
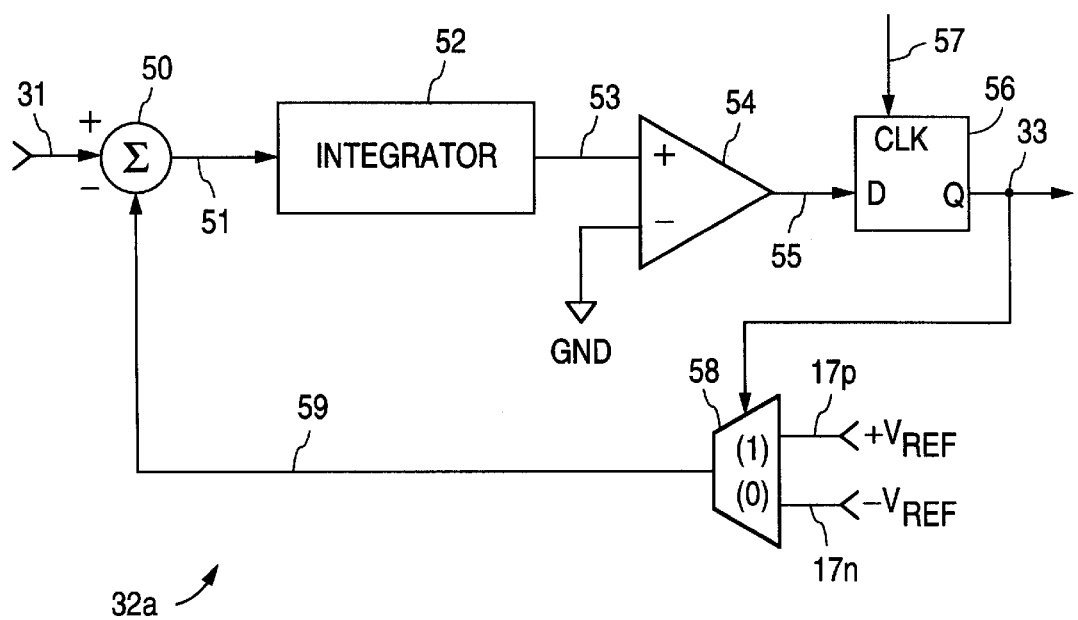
FIG. 7 is a functional block diagram of a sigma delta analog-to-digital converter suitable for use as the analog-to-digital converter in the sampling circuit of FIG. 3.

Referring to FIG. 7, one embodiment 32a of the ADC 32 of FIG. 3 can be a delta-sigma ADC ("$\Delta\Sigma$-ADC") implemented as shown. The analog sample voltage 31 is summed in a signal summer 50 with the inverse of a feedback signal 59 (discussed in more detail below). The resulting sum signal 51 is integrated in an integrator circuit 52. The integrated signal 53 is then compared against circuit ground in a comparator 54. The resulting binary comparison signal 55 is latched in a D-type flip-flop 56 in accordance with a clock signal 57. The output signal 33 from the flip-flop 56 is used as a selection control signal for a multiplexor 58. When this control signal 33 is a logic 0, the inverse $-V_{REF}$ 17n of the reference voltage 17 from the reference generator 16 is used as the feedback signal 59 which is subtracted from the analog sample signal 31 in the input signal summer 50, as discussed above. When this control signal 33 is a logic 1, the positive version 17p of the reference voltage 17 is used as the feedback signal 59. Because of this subtraction of the reference voltage 17 from the analog sample signal 31, the output signal 33 from the flip-flop 56 is a pulse density modulated ("PDM") digital signal. (While this embodiment 32a of the ADC 32 is shown as being a first order ADC with two-level quantization, it will be understood that higher order ADCs with mulilevel quantization could be used as well when implementing the ADC 32 of FIG. 3.)

Figure 8A:
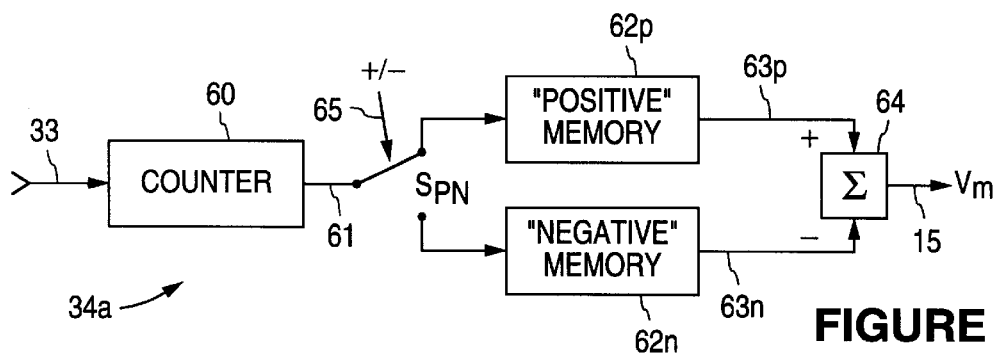
FIGS. 8A and 8B are functional block diagrams of the counter/subtractor of FIG. 3.

Referring to FIG. 8A, one embodiment 34a of the counter/subtractor 34 of FIG. 3 for use with a $\Delta\Sigma$-ADC can be implemented as shown. The pulse density modulated signal 33 from the ADC 32 (FIG. 3) is counted by a counter 60. The resulting count 61 is then stored in either a "positive" memory 62p or "negative" memory 62n, depending upon whether positive or negative sampling is being performed. Routing of the count 61 to the appropriate memory stage 62p, 62n, is done by a switch $S_{PN}$ controlled by a control signal 65. The negative count 63n is then subtracted from the positive count 63p within an adder circuit 64 to produce the digital signal 15 representing the measured voltage.

Figure 8B:
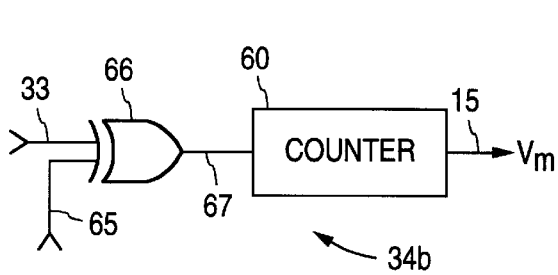

Referring to FIG. 8B, another embodiment 34b of the counter/subtractor 34 of FIG. 3 for use with a $\Delta\Sigma$-ADC can be implemented as shown. The pulse density modulated signal 33 from the ADC 32 (FIG. 7) is gated by the control signal 65 in an exclusive-OR gate 66 prior to being counted by the counter 60. The control signal 65 is a logic 0 during positive sampling and a logic 1 during negative sampling, thereby providing the desired signal inversion via the operation of the exclusive-OR gate 66 when the input signal $V_A-V_B$ is negative.

Figure 8C:
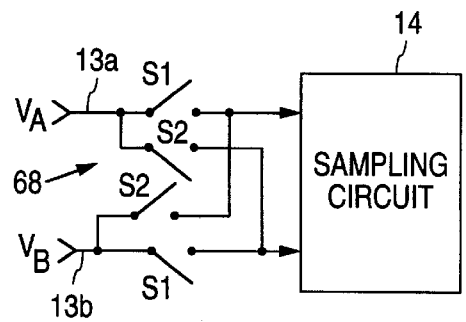
FIG. 8C illustrates how the inversion function performed by the circuits of FIGS. 8A and 8B can be performed by a matrix of switches at the input to the sampling circuit of FIG. 1.

Referring to FIG. 8C, the desired signal inversion can alternatively be achieved by a matrix 68 of switches $S_1$, $S_2$ between the input terminals 13a, 13b and the sampling circuit 14. When the input signal $V_A-V_B$ is positive the $S_1$ switches are closed and the $S_2$ switches are open, and when the input signal $V_A-V_B$ is negative the $S_1$ switches are open and the $S_2$ switches are closed.

This subtraction operation is performed so as to minimize any contributions to the digital voltage signal 15 due to offsets within the sensing circuit 10. It can be shown that by doing this, any such offsets are essentially cancelled in accordance with the following expression:

$$V_{IN} = \frac{(V_{IN(+)} + V_{OFFSET}) - (-V_{IN(-)} + V_{OFFSET})}{2}$$

Figure 9:
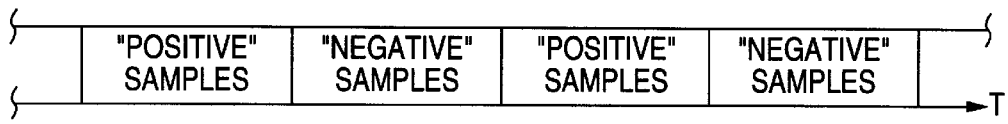
FIG. 9 represents the time multiplexed nature of the sampling performed by the sampling circuit of FIG. 1.

Referring to FIG. 9, the above-discussed alternating "positive" and "negative" sampling can be visualized as a time multiplexed operation as shown.

Figure 10:
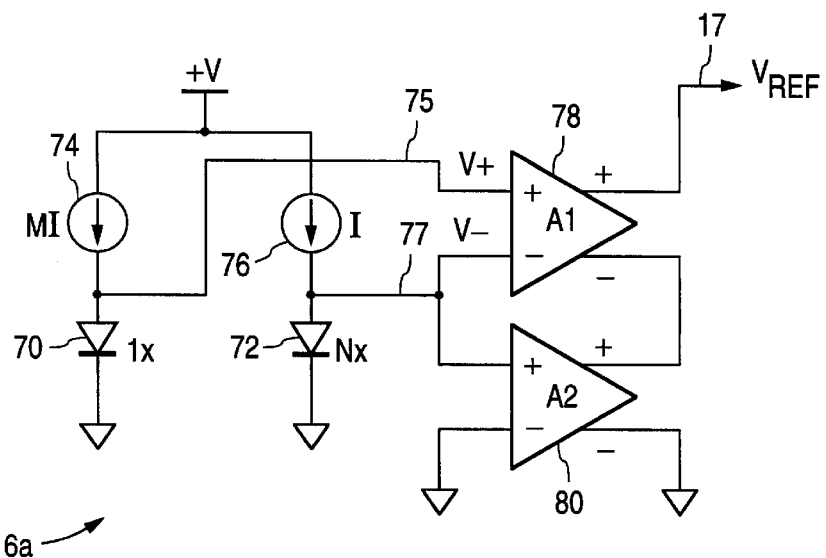
FIG. 10 is a schematic diagram of one embodiment of the reference generator of FIG. 1.

Referring to FIG. 10, one embodiment 16a of the reference generator 16 of FIG. 1 can be implemented as shown. In accordance with well known bandgap voltage generator techniques, a reference voltage can be generated with a predetermined temperature coefficient. Two diodes 70, 72 are driven to conductive states by respective current sources 74, 76. The voltage V+, V− across each diode 70, 72, i.e., at the anode, is dependent upon the current density through the diode and the temperature of the diode. By making the current densities within the diodes 70, 72 different, and comparing the resulting voltages 75, 77 across the diodes 70, 72 with a differential amplifier 78, a reference voltage 17 can be generated with a voltage which changes with temperature in accordance with a temperature coefficient proportional to absolute temperature.

For example, if the two diodes 70, 72 are equal in size (i.e., N=1) and the first diode 70 is driven by a current MI which is M-times larger than the current I driving the second diode 72, then the voltage difference ΔV (V+−V−) between the voltages 75, 77 across the two diodes 70, 72 can be shown to be determined in accordance with the following expression:

$$\Delta V = V_T (lnM)$$

Alternatively, if the second diode 72 is N-times larger than the first diode 70 and the diodes 70, 72 are driven by equal currents (i.e., M=1), then the voltage difference ΔV between the voltages 75, 77 can be shown to be determined in accordance with the following expression:

$$\Delta V = V_T (ln[1/N])$$

Provided that the currents MI, I through the diodes 70, 72 are not equal, the diode voltage difference ΔV is proportional to absolute temperature and has a temperature coefficient $T_{C(\Delta V)}$ of approximately +3000 ppm. This is inverse to the temperature coefficient $T_{C(V-)}$ of approximately −3000 ppm for the voltage V− across the larger diode 72. Therefore, using both the diode voltage difference ΔV and the single diode voltage V− with differential amplifiers 78, 80 having voltage gains $A_1$ and $A_2$, respectively, to generate the reference voltage $V_{REF}$ 17 allows the reference voltage $V_{REF}$ 17 to be generated anywhere within a range bounded by the diode voltage difference ΔV temperature coefficient $T_{C(\Delta V)}$ and the single diode voltage V− temperature coefficient $T_{C(V-)}$ in accordance with the following expression:

$$V_{REF} = A1 * \Delta V + A2 * V-$$

Various other modifications and alterations in the structure and method of operation of this invention will be apparent to those skilled in the art without departing from the scope and spirit of the invention. Although the invention has been described in connection with specific preferred embodiments, it should be understood that the 0o invention as claimed should not be unduly limited to such specific embodiments. It is intended that the following claims define the scope of the present invention and that structures and methods within the scope of these claims and their equivalents be covered thereby.

What is claimed is:

1. An apparatus including a current sensing circuit, comprising:

a resistive circuit having a resistance which varies in a first relation to temperature and configured to conduct a measured current and in response thereto provide a measured voltage which is proportional to said measured current and said resistance;

a signal sampling circuit, coupled to said resistive circuit, configured to sample said measured voltage and receive a reference signal and in accordance therewith provide an output signal with a plurality of values which represent a plurality of values of said measured voltage in accordance with a predetermined gain relationship and correspond to a plurality of values of said measured current; and a reference signal generator circuit, coupled to said signal sampling circuit, configured to generate said reference signal, wherein said reference signal varies in a second relation to temperature which is approximately equal in magnitude to said first temperature relation, and wherein said correspondence between selected ones of said plurality of output signal values and selected ones of said plurality of measured current values is substantially maintained over a plurality of temperatures.

2. The apparatus of claim 1, wherein said apparatus further includes an integrated circuit in which said current sensing circuit is contained.

3. The apparatus of claim 1, wherein:

said apparatus figurer includes an enclosure with a plurality of signal terminals;

said current sensing circuit is contained within said enclosure; and said resistive circuit comprises a conductive connection between first and second ones of said plurality of signal terminals.

4. The apparatus of claim 1, wherein said signal sampling circuit comprises:

a plurality of switching circuits configured to receive a plurality of control signals and in accordance therewith sample said measured voltage and in accordance therewith provide a sample signal;

a plurality of capacitive circuits, coupled to said plurality of switching circuits, configured to receive said sample signal and in accordance therewith provide a sample voltage which varies in relation to said measured voltage.

5. The apparatus of claim 4, wherein said signal sampling circuit further comprises an analog-to-digital signal conversion circuit.

6. The apparatus of claim 5, wherein said analog-to-digital signal conversion circuit comprises a pulse density modulation circuit configured to receive said reference signal and said sample voltage and in accordance therewith provide a pulse density modulated signal as said output signal.

7. The apparatus of claim 1, wherein said reference signal generator circuit comprises a bandgap voltage amplifier circuit configured to generate and compare first and second bandgap voltages which correspond to first and second reference currents having first and second current densities, respectively, and in accordance therewith provide said reference signal.

8. The apparatus of claim 1, wherein said output signal comprises a digital signal with first and second states which are mutually inverse representations of said measured voltage, and wherein said apparatus further comprises:

a counter circuit, coupled to said signal sampling circuit, configured to receive and count said output signal and in accordance therewith provide first and second count signals which correspond to said first and second digital signal states; and a subtraction circuit, coupled to said counter circuit, configured to receive and subtract said first count signal from said second count signal and in accordance therewith provide a digital difference signal with a plurality of values which represent said plurality of measured voltage values and correspond to said plurality of measured current values.

9. The apparatus of claim 1, wherein said output signal comprises a digital signal with first and second states which are mutually inverse representations of said measured voltage, and wherein said apparatus further comprises:

an inversion circuit, coupled to said signal sampling circuit, configured to receive and selectively invert said output signal and in accordance therewith provide a selectively inverted signal; and a counter circuit, coupled to said inversion circuit, configured to receive and count said selectively inverted signal and in accordance therewith provide first and second count signals which correspond to said first and second digital signal states.

10. A method of sensing a current, comprising the steps of:

conducting a measured current with a resistive circuit having a resistance which varies in a first relation to temperature and in response thereto generating a measured voltage which is proportional to said measured current and said resistance;

sampling said measured voltage and receiving a reference signal and in accordance therewith generating an output signal with a plurality of values which represent a plurality of values of said measured voltage in accordance with a predetermined gain relationship and correspond to a plurality of values of said measured current; and generating said reference signal in a manner wherein said reference signal varies in a second relation to temperature which is approximately equal in magnitude to said first temperature relation, wherein said correspondence between selected ones of said plurality of output signal values and selected ones of said plurality of measured current values is substantially maintained over a plurality of temperatures.

11. The method of claim 10, further comprising the step of performing the steps of claim 10 in an integrated circuit.

12. The method of claim 10, further comprising the step of performing the steps of claim 10 in an enclosure with a plurality of signal terminals, and wherein said step of conducting a measured current with a resistive circuit having a resistance which varies in a first relation to temperature and in response thereto generating a measured voltage which is proportional to said measured current and said resistance comprises conducting said measured current with a conductive connection between first and second ones of said plurality of signal terminals.

13. The method of claim 10, wherein said step of sampling said measured voltage and receiving a reference signal and in accordance therewith generating an output signal with a plurality of values which represent a plurality of values of said measured voltage in accordance with a predetermined gain relationship and correspond to a plurality of values of said measured current comprises:

receiving a plurality of control signals and in accordance therewith sampling said measured voltage and in accordance therewith generating a sample signal;

receiving said sample signal and in accordance therewith capacitively generating a sample voltage which varies in relation to said measured voltage.

14. The method of claim 13, wherein said step of sampling said measured voltage and receiving a reference signal and in accordance therewith generating an output signal with a plurality of values which represent a plurality of values of said measured voltage in accordance with a predetermined gain relationship and correspond to a plurality of values of said measured current further comprises the step of performing an analog-to-digital signal conversion upon said measured voltage.

15. The method of claim 14, wherein said step of performing an analog-to-digital signal conversion upon said measured voltage comprises receiving said reference signal and said sample voltage and in accordance therewith generating a pulse density modulated signal as said output signal.

16. The method of claim 10, wherein said step of generating said reference signal in a manner wherein said reference signal varies in a second relation to temperature which is approximately equal in magnitude to said first temperature relation comprises generating and comparing first and second bandgap voltages which correspond to first and second reference currents having first and second current densities, respectively, and in accordance therewith generating said reference signal.

17. The method of claim 10, wherein said output signal comprises a digital signal with first and second states which are mutually inverse representations of said measured voltage, and further comprising the steps of:

counting said output signal and in accordance therewith generating first and second count signals which correspond to said first and second digital signal states; and subtracting said first count signal from said second count signal and in accordance therewith generating a digital difference signal with a plurality of values which represent said plurality of measured voltage values and correspond to said plurality of measured current values.

18. The method of claim 10, wherein said output signal comprises a digital signal with first and second states which are mutually inverse representations of said measured voltage, and further comprising the steps of:

receiving and selectively inverting said output signal and in accordance therewith generating a selectively inverted signal; and counting said selectively inverted signal and in accordance therewith generating first and second count signals which correspond to said first and second digital signal states.

* * * * *

UNITED STATES PATENT AND TRADEMARK OFFICE
CERTIFICATE OF CORRECTION

PATENT NO.: 5,867,054
DATED: February 2, 1999
INVENTOR(S): JEFFREY P. KOTOWSKI

It is certified that errors appear in the above-identified patent and that said Letters Patent is hereby corrected as shown below:

In Col. 6, line 41, delete "figurer" and replace with --further--.

Signed and Sealed this

Twenty-second Day of June, 1999

Attest:

Q. TODD DICKINSON

*Attesting Officer*   *Acting Commissioner of Patents and Trademarks*